(12) United States Patent
Liu et al.

(10) Patent No.: US 12,219,844 B2
(45) Date of Patent: Feb. 4, 2025

(54) DISPLAY PANEL AND DISPLAY DEVICE

(71) Applicant: Wuhan China Star Optoelectronics Semiconductor Display Technology Co., Ltd., Hubei (CN)

(72) Inventors: Wei Liu, Hubei (CN); Lin Yang, Hubei (CN); Yexi Sun, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 720 days.

(21) Appl. No.: 17/288,964

(22) PCT Filed: Feb. 26, 2021

(86) PCT No.: PCT/CN2021/078067
§ 371 (c)(1),
(2) Date: Apr. 27, 2021

(87) PCT Pub. No.: WO2022/160400
PCT Pub. Date: Aug. 4, 2022

(65) Prior Publication Data
US 2023/0157116 A1    May 18, 2023

(30) Foreign Application Priority Data
Jan. 27, 2021  (CN) .................. 202110107621.X

(51) Int. Cl.
*H10K 59/80* (2023.01)
*H10K 59/35* (2023.01)
*H10K 59/65* (2023.01)

(52) U.S. Cl.
CPC ......... *H10K 59/353* (2023.02); *H10K 59/351* (2023.02); *H10K 59/65* (2023.02); *H10K 59/80515* (2023.02)

(58) Field of Classification Search
CPC ........... H10K 59/353; H10K 59/80515; H10K 59/121; H10K 59/352
See application file for complete search history.

(56) References Cited

U.S. PATENT DOCUMENTS

2003/0137255 A1\* 7/2003 Park ...................... H10K 59/121
315/169.3
2005/0280614 A1\* 12/2005 Goh ..................... G09G 3/3233
345/76

(Continued)

FOREIGN PATENT DOCUMENTS

CN   106129100    11/2016
CN   107665905    2/2018

(Continued)

*Primary Examiner* — Michele Fan

(57) ABSTRACT

The present disclosure discloses a display panel and a display device. The display panel includes an array substrate and a plurality of pixel units. In a first display area, a minimum distance between an edge of an anode of a second pixel unit and an edge of a corresponding light-emitting portion is greater than a minimum distance between an edge of an anode of a first pixel unit and an edge of a corresponding light-emitting portion. The display panel and the display device provided by the present disclosure prevents a problem that user experience is compromised by differences in brightness of the display panel at wide viewing angles.

20 Claims, 7 Drawing Sheets

(56) References Cited

U.S. PATENT DOCUMENTS

| | | | | |
|---|---|---|---|---|
| 2015/0261258 A1* | 9/2015 | Kim | ............... | H10K 50/11 |
| | | | | 345/173 |
| 2021/0126065 A1* | 4/2021 | Kwon | ............... | H10K 59/351 |
| 2021/0184155 A1* | 6/2021 | Chae | ............... | H10K 59/353 |

FOREIGN PATENT DOCUMENTS

| | | | | |
|---|---|---|---|---|
| CN | 108400154 | | 8/2018 | |
| CN | 109742107 | | 5/2019 | |
| CN | 110489012 | | 11/2019 | |
| CN | 111048569 | | 4/2020 | |
| CN | 111146362 | | 5/2020 | |
| CN | 210575958 | | 5/2020 | |
| CN | 111341936 | | 6/2020 | |
| CN | 111984153 A | * | 11/2020 | ......... G06F 3/0412 |
| CN | 211980618 | | 11/2020 | |
| CN | 112072000 | | 12/2020 | |
| CN | 112106204 | | 12/2020 | |
| JP | 2004-335392 | | 11/2004 | |
| JP | 2018006232 A | * | 1/2018 | |

\* cited by examiner

DISPLAY PANEL AND DISPLAY DEVICE

RELATED APPLICATIONS

This application is a National Phase of PCT Patent Application No. PCT/CN2021/078067 having International filing date of Feb. 26, 2021, which claims the benefit of priority of Chinese Patent Application No. 202110107621.X filed on Jan. 27, 2021. The contents of the above applications are all incorporated by reference as if fully set forth herein in their entirety.

FIELD AND BACKGROUND OF THE INVENTION

The present disclosure relates to the field of display technology, specifically to a display panel and a display device.

With the development of portable electronic devices (such as mobile phones, tablet computers, e-books, and navigation devices) industry, camera under panel (CUP) technology bringing better visual enjoyment and interference-free, all-around display has gradually become a development trend.

A current CUP display device refers to a display device that can display a position of a camera. By increasing light transmittance of a display area corresponding to the camera in a display panel (referred to as a camera area), the camera area can display screen content normally when not taking pictures; and when taking pictures, good light transmittance can meet lighting requirements of the camera. Due to high requirements for optical performance of the camera area, the prior art adopts a differentiated design method for a display panel area corresponding to the camera area to increase the light transmittance of the camera area, such as thinning or removing a light-shielding metal corresponding to the camera area. However, this will result in a difference between the camera area and a normal display area of the display panel. The difference is caused by the light-shielding metal shielding light emitted from pixels. Especially in the case of wide viewing angles, the difference will become more and more obvious. In order to decrease the display difference at wide viewing angles, an effective solution needs to be proposed.

SUMMARY OF THE INVENTION

The embodiments of the present disclosure provide a display panel and a display device thereof, which can reduce the display difference between the camera area and the conventional display area in the prior art, improve the overall display uniformity effect of the display panel and the display device, and enhance the user experience.

To solve the above problem, the present disclosure provides the following technical solution:

An embodiment of the present disclosure provides a display panel, wherein the display panel comprises:

An array substrate;

A plurality of pixel units disposed on the array substrate, and each of the pixel units comprises: an anode, a light-emitting portion, and a cathode that are sequentially stacked;

An encapsulation layer disposed on the plurality of pixel units; and

A touch layer disposed on the encapsulation layer,

Wherein the display panel comprises a first display area and a second display area disposed adjacent to the first display area, and a light transmittance of the touch layer in the first display area is less than a light transmittance of the touch layer in the second display area; and In the first display area, the plurality of pixel units comprise first pixel units and second pixel units, and a minimum distance between an edge of an anode of at least one of the second pixel units and an edge of a corresponding light-emitting portion is greater than a minimum distance between an edge of an anode of each of the first pixel units and an edge of a corresponding light-emitting portion.

Alternatively, the anode of each of the pixel units comprises a first portion overlapping with the light-emitting portion and a second portion disposed around the first portion, a minimum width of the second portion corresponding to each of the first pixel units is a first width, a minimum width of the second portion corresponding to each of the second pixel units is a second width, and the second width of at least one of the second pixel units is greater than all the first widths.

Alternatively, the second widths of all the second pixel units are greater than the first widths of all the first pixel units, or, The second width of at least one of the second pixel units is greater than all of the first widths, and the second widths of the other second pixel units are equal to a largest first width.

Alternatively, the second portion of each of the first pixel units forms a first annular portion, and a difference between a maximum width and a minimum width of the first annular portions is a; the second portion of each of the second pixels forms a second annular portion, and a difference between a maximum width and a minimum width of the second annular portions is b; wherein 0 μm≤a≤0.1 μm; b≥0 μm.

Alternatively, a pattern delineated by the edge of the anode of each of the first pixel units is same as a pattern delineated by the edge of the light-emitting portion of the first pixel unit; and a pattern delineated by the edge of the anode of each of the second pixel units is same or different from a pattern delineated by the edge of the light-emitting portion of the second pixel unit.

Alternatively, the first pixel units and the second pixel units emit light of different colors, and areas of the light-emitting portions of the first pixel units are greater than areas of the light-emitting portions of the second pixel units.

Alternatively, in the second pixel units, a ratio of an area of the second portion of the anode to a total area of the anode is greater than or equal to 47.16%.

Alternatively, the first width of each of the first pixel units is same, the second width of each of the second pixel units is same, and a difference between the second width and the first width is greater than or equal to 0.1 μm.

Alternatively, the first pixel units comprise red pixel units and/or blue pixel units, and the second pixel units comprise green pixel units.

Alternatively, in the second display area, the plurality of pixel units comprise third pixel units that emit light of a same color as the first pixel units and fourth pixel units that emit light of a same color as the second pixel units, wherein, A minimum width of the second portion of each of the third pixel units is a third width, a minimum width of the second portion of each of the fourth pixel units is a fourth width, and the first width, the third width, and the fourth width are all less than the second width.

Alternatively, a pattern delineated by an edge of an anode of each of the third pixel units is same as a pattern delineated by an edge of a light-emitting portion of the third pixel unit; and a pattern delineated by an edge of an anode of each of the fourth pixel units is same as a pattern delineated by an edge of a light-emitting portion of the fourth pixel unit.

Alternatively, the third width is same as the fourth width.

Alternatively, the touch layer is defined with an opening at a position corresponding to the second display area, and a density of the pixel units in the second display area is same as a density of the pixel units in the first display area.

Alternatively, an area of the light-emitting portion of each of the third pixel units is less than an area of the light-emitting portion of each of the first pixel units, and an area of the light-emitting portion of each of the fourth pixel units is less than an area of the light-emitting portion of each of the second pixel units.

Correspondingly, the present disclosure further provides a display device, wherein the display device comprises a camera and a display panel, and the camera is disposed on a side of the display panel corresponding to a second display area, wherein the display panel comprises:

An array substrate;

A plurality of pixel units disposed on the array substrate, and each of the pixel units comprises: an anode, a light-emitting portion, and a cathode that are sequentially stacked;

An encapsulation layer disposed on the plurality of pixel units; and

A touch layer disposed on the encapsulation layer,

Wherein the display panel comprises a first display area and the second display area disposed adjacent to the first display area, and a light transmittance of the touch layer in the first display area is less than a light transmittance of the touch layer in the second display area; and In the first display area, the plurality of pixel units comprise first pixel units and second pixel units, and a minimum distance between an edge of an anode of at least one of the second pixel units and an edge of a corresponding light-emitting portion is greater than a minimum distance between an edge of an anode of each of the first pixel units and an edge of a corresponding light-emitting portion.

Alternatively, the anode of each of the pixel units comprises a first portion overlapping with the light-emitting portion and a second portion disposed around the first portion, a minimum width of the second portion corresponding to each of the first pixel units is a first width, a minimum width of the second portion corresponding to each of the second pixel units is a second width, and the second width of at least one of the second pixel units is greater than all the first widths.

Alternatively, the second widths of all the second pixel units are greater than the first widths of all the first pixel units, or, The second width of at least one of the second pixel units is greater than all of the first widths, and the second widths of the other second pixel units are equal to a largest first width.

Alternatively, the first pixel units and the second pixel units emit light of different colors, and areas of the light-emitting portions of the first pixel units are greater than areas of the light-emitting portions of the second pixel units.

Alternatively, the first pixel units comprise red pixel units and/or blue pixel units, and the second pixel units comprise green pixel units.

Alternatively, in the second display area, the plurality of pixel units comprise third pixel units that emit light of a same color as the first pixel units and fourth pixel units that emit light of a same color as the second pixel units, wherein, A minimum width of the second portion of each of the third pixel units is a third width, a minimum width of the second portion of each of the fourth pixel units is a fourth width, and the first width, the third width, and the fourth width are all less than the second width.

The display panel and the display device provided by the present disclosure set a minimum distance between the edge of the anode of at least one second pixel unit of the plurality of pixel units in the first display area and the edge of the corresponding light-emitting portion to be greater than a minimum distance between the edge of the anode of each of the first pixel units and the edge of the corresponding light-emitting portion of the first pixel unit, which increases amount of light output from the first display area in wide viewing angles, improves consistency of display effects of the first display area and the second display area, improves display effect of the display panel in the wide viewing angles, and prevents problems of reducing user experience caused by differences in brightness of the display panel in the wide viewing angles.

BRIEF DESCRIPTION OF THE SEVERAL VIEWS OF THE DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DESCRIPTION OF SPECIFIC EMBODIMENTS OF THE INVENTION

Figure 1:
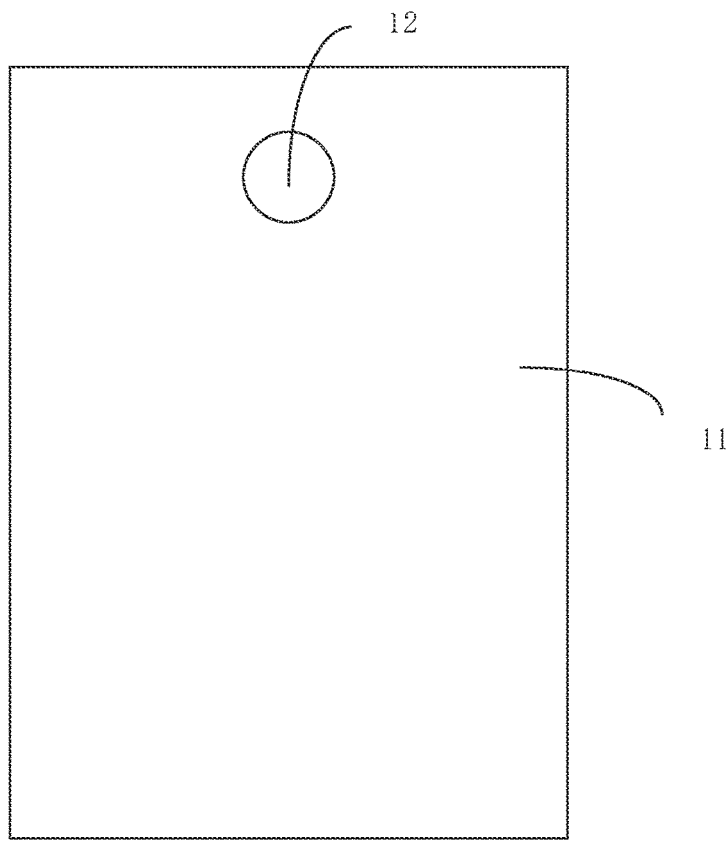
FIG. 1 is a top view of a display panel provided by a first embodiment of the present disclosure.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that the specific implementations described here are only used to illustrate and explain the present disclosure, and are not used to limit the present disclosure. In the present disclosure, unless otherwise stated, directional words used such as "upper" and "lower" generally refer to the upper and lower directions of the device in actual use or working state, and specifically refer to the drawing directions in the drawings; and "inner" and "outer" refer to the outline of the device.

An embodiment of the present disclosure provides a display panel and a display device. Detailed descriptions are given below. It should be noted that an order of description in the following embodiments is not meant to limit the preferred order of the embodiments.

The present disclosure provides a display panel and a display device. The display panel comprises an array substrate; a plurality of pixel units disposed on the array substrate, wherein each pixel unit comprises an anode, a light-emitting portion, and a cathode that are stacked in sequence; an encapsulation layer disposed on the plurality of pixel units; a touch layer disposed on the encapsulation layer; wherein, the display panel is provided with a first display area and a second display area adjacent to the first display area, and a light transmittance of the touch layer in the first display area is less than a light transmittance of the touch layer in the second display area; in the first display area, the plurality of pixel units comprise first pixel units and second pixel units, and a minimum distance between an edge of an anode of at least one of the second pixel units and an edge of a corresponding light-emitting portion is greater than a minimum distance between an edge of an anode of the first pixel units and an edge of a corresponding light-emitting portion. In the display panel and the display device provided by the present disclosure, in the first display area, by setting the minimum distance between the edge of the anode of at least one of the second pixel units of the plurality of pixel units and the edges of the corresponding light-emitting portions to be greater than the minimum distance between the edges of the anodes of the first pixel units and the edges of the corresponding light-emitting portions, anode areas of at least part of the second pixel units are additionally increased, and the increased anode areas of the second pixel units can be configured to reflect light generated by the corresponding second pixel units, which increases amount of light output from the first display area at wide viewing angles, improves consistency of display effects of the first display area and the second display area, improves display effect of the display panel in the wide viewing angles, and prevents problems of compromising user experience caused by differences in brightness of the display panel at wide viewing angles.

A First Embodiment

Figure 2:
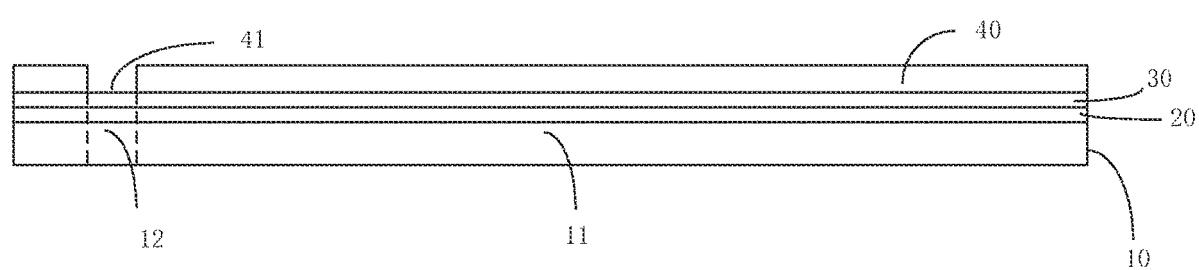
FIG. 2 is a front view of the display panel provided by the first embodiment of the present disclosure.
Figure 3:
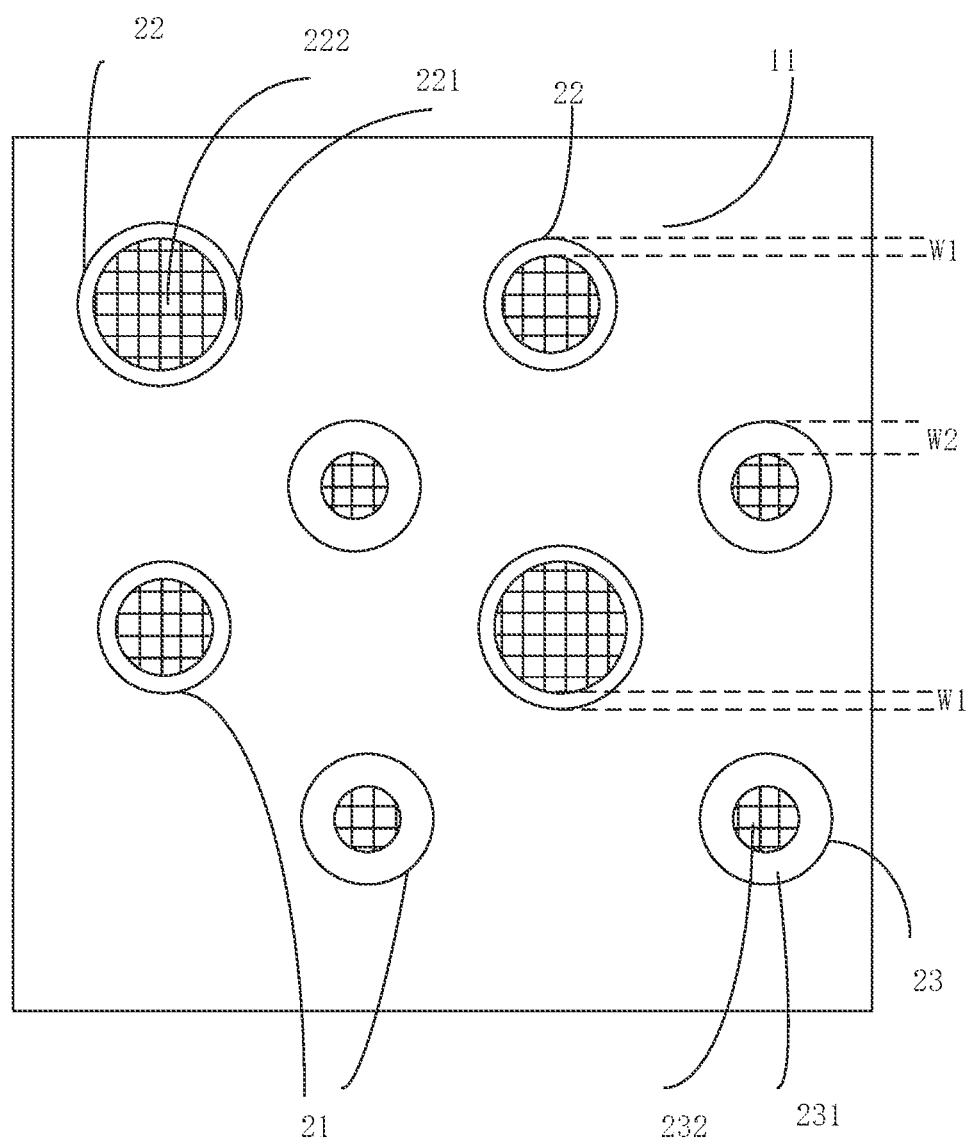
FIG. 3 is a schematic structural diagram of anodes and light-emitting portions of pixel units of a first display area provided by the first embodiment of the present disclosure.

FIG. 1 is a top view of a display panel provided by a first embodiment of the present disclosure; FIG. 2 is a front view of the display panel provided by the first embodiment of the present disclosure; and FIG. 3 is a schematic structural diagram of anodes and light-emitting portions of pixel units of a first display area provided by the first embodiment of the present disclosure. As shown in FIGS. 1-3, the first embodiment of the present disclosure provides a display panel, a type of which is, for example, an organic light-emitting diode (OLED) display panel. The display panel comprises an array substrate 10, a pixel layer 20, an encapsulation layer 30, and a touch layer 40 stacked in sequence. The display panel is provided with a first display area 11 and a second display area 12 that are arranged adjacent to each other. Specifically, the display panel is provided with one first display area 11 and one second display area 12, and the first display area 11 is disposed around the second display area 12. In other embodiments of the present disclosure, the second display area 12 may be further disposed on one or more sides of the first display area 11, and there can be one or more second display area 12.

The array substrate 10 comprises, for example, an array substrate body and a pixel driving circuit disposed on the array substrate body. The array substrate body may be a flexible substrate or a rigid substrate, and materials thereof comprise one or more of glass, plastic, silicon dioxide, polyethylene, polypropylene, polystyrene, polylactic acid, polyethylene terephthalate, polyimide, or polyurethane.

The pixel layer 20 is disposed on the array substrate 10 and comprises a multi-layer structure. Specifically, the pixel layer 20 comprises, for example, an anode layer, an organic light-emitting layer, and a cathode layer. Wherein, the anode layer in the pixel layer 20 is composed of, for example, an opaque material, which can reflect light directed to the anode layer. For example, the anode layer is composed of three laminated layers of transparent conductive layer, silver, and transparent conductive layer. The transparent conductive layer is made of, for example, an indium tin oxide (ITO) material, and the anode layer comprises a plurality of anodes that are patterned and arranged at intervals. For example, a pixel defining layer is further disposed on the anode layer and is provided with pixel defining openings corresponding to positions of the plurality of anodes. The organic light-emitting layer in the pixel layer 20 is disposed on the pixel defining layer and comprises a plurality of light-emitting portions patterned and arranged at intervals, and the plurality of light-emitting portions are correspondingly disposed in the pixel defining openings on the plurality of anodes. The cathode layer is disposed on the organic light-emitting layer, and the cathode layer is, for example, a silver metal film, which has a semi-transmissive and semi-reflective optical effect. A plurality of pixel units 21 are disposed in the first display area 11, and the plurality of pixel units 21 in the first display area comprise a plurality of first pixel units 22 and a plurality of second pixel units 23, and a minimum distance between an edge of an anode of at least one of the second pixels 23 and an edge of a corresponding light-emitting portion is greater than a minimum distance between edges of anodes of the first pixel units and an edge of a corresponding light-emitting portion. In the present disclosure, anode areas of at least part of the second pixel units are additionally increased, and the increased anode areas of the second pixel units can be configured to reflect light generated by the corresponding second pixel units, which increases an amount of light output from the first display area in the wide viewing angles, increases brightness of light, and increases light output angles of the second pixel units at wide viewing angles, improves consistency of display effects of the first display area and the second display area, improves display effect of the display panel in the wide viewing angles, and prevents problems of compromising user experience caused by differences in brightness of the display panel at wide viewing angles.

The encapsulation layer 30 is disposed on the pixel layer 20 and configured to ensure sealing effect of the pixel units 21 in the pixel layer 20, in order to prevent water vapor and oxygen from entering and corroding the pixel units 21.

The touch layer 40 is disposed on the encapsulation layer 30, and the touch layer 40 is defined with an opening 41 at a position corresponding to the second display area 12, i.e., no touch electrode is directly disposed in the second display area 12. Touch electrodes of the touch layer 40 may adopt a metal mesh structure. Specifically, the touch layer 40 does not block the pixel units 21 on the first display area 11 when viewed from front, but the metal mesh structure will reflect and block light emitted by the pixel unit 21 at wide viewing angles. Therefore, the second display area 12 has a higher light output rate than the first display area 11 at wide viewing angles. Of course, in other embodiments, the touch control layer 40 located at a position corresponding to the second display area 12 may also be other designs that can increase the light transmittance of the second display area 12 so that the touch layer 40 is in the first display area 11 and the second display area 12 have different light output rates. For example, a material of the touch layer 40 corresponding to the second display area 12 adopts transparent wires with a higher light transmittance, which is not limited in this embodiment.

Figure 4:
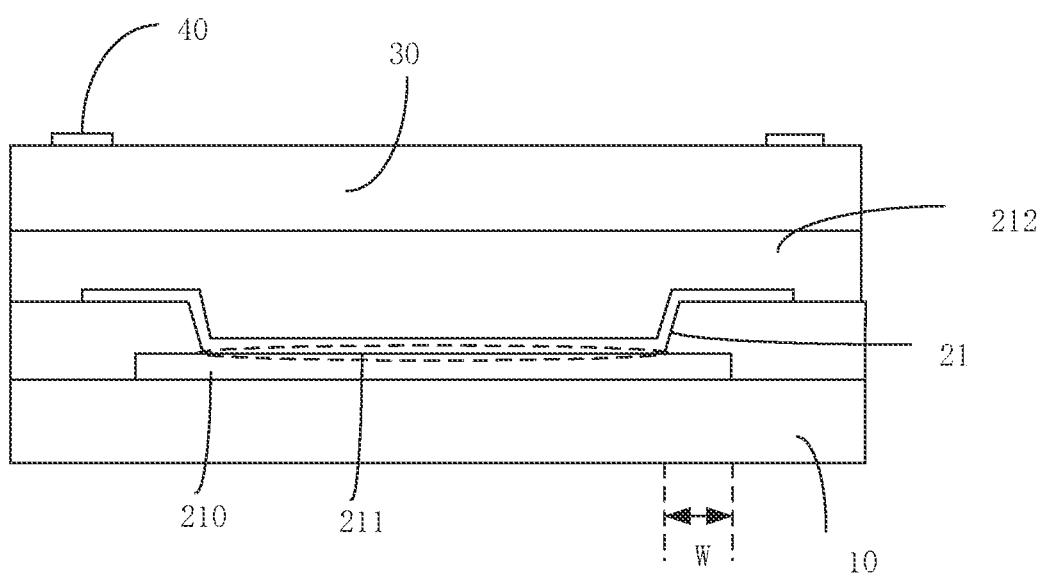
FIG. 4 is a schematic structural diagram of the pixel unit provided by the first embodiment of the present disclosure.

FIG. 4 is a schematic structural diagram of the pixel unit provided by the first embodiment of the present disclosure. As shown in FIG. 2, FIG. 3, and FIG. 4, the pixel layer 20 comprises a plurality of pixel units 21, the plurality of pixel units 21 are distributed in the first display area 11 and the second display area 12. Each pixel unit 21 comprises an anode 210, a light-emitting portion 211, and a cathode 212 stacked in sequence. The anode 210 of each pixel unit 21 comprises a first portion overlapping the light-emitting portion 211 and a second portion surrounding the first portion. That is, an area of the first portion is equal to a projection area of the light-emitting portion 211 on the array substrate 10 (that is, an area corresponding to a projection of a dotted line portion on the array substrate 10). A distance between an edge of the anode 210 of each of the pixel units 21 and an edge of a corresponding light-emitting portion 211 is W, wherein the pixel units 21 comprise first pixel units 22 and second pixel units 23 located in the first display area, and the first pixel units 22 and the second pixel units 23 are both provided in multiples. A minimum width of a second portion 221 corresponding to each first pixel unit 22 is a first width W1, a minimum width of a second portion 231 corresponding to each second pixel unit 23 is a second width W2, and the second width W2 of at least one of the second pixel units 23 is greater than all the first widths W1. Specifically, the second widths W2 of all the second pixel units 23 are greater than the first widths W1 of all the first pixel units 22, i.e., the second width W2 of the second portion 231 of any second pixel unit 23 is greater than all the first widths W1.

In this embodiment, the second portion 221 of each of the first pixel units 22 forms a first annular portion, and a difference between a maximum width and a minimum width of the first annular portions is defined as a; the second portion of each of the second pixels forms a second annular portion, and a difference between a maximum width and a minimum width of the second annular portions is defined as b, wherein 0≤a≤0.1 μm; b≥0 μm. That is, the second portions 221 of the first pixel units 22 are annular areas with a fixed width difference interval, and the second portions 231 of the second pixel units 23 are annular areas with a fixed width difference interval, or annular areas with a non-fixed width difference interval. Preferably, in this embodiment, the second portions 231 of the second pixel units 23 are also annular areas with a fixed width difference interval. In order to accommodate process errors, the difference value between the maximum width and the minimum width of the annular areas is greater than or equal to 0 and less than or equal to 0.1 μm. Of course, no limitation is set on the width difference interval of the annular portions of the first pixel units 22 in the present disclosure, and in other embodiments, the width difference may be greater than or equal to 0.1 μm.

Further, a pattern delineated by edges of the anodes of the first pixel units 22 is same as a pattern delineated by edges of the light-emitting portions of the first pixel units 22. A pattern delineated by the anode edge of each of the second pixel units 23 is same as a pattern delineated by the edge of the light-emitting portion of the second pixel unit 23, and the pattern is, for example, a circle. In other embodiments of the present disclosure, the pattern may be an oval, a diamond, a triangle, a pearl, other polygons, or any irregular shape, and specific shapes thereof can be adaptively set according to actual needs. No limitation is set herein in this embodiment. It should be noted that when the pattern of the edges of the anodes of the pixel units (including the first pixel units and the second pixel units) and the pattern of the edges of the corresponding light-emitting portions are same, the minimum width and the maximum width of the second portion corresponding to each of the first pixel units may both be the first width, and the minimum width and the maximum width of the second portion corresponding to each of the second pixel units may both be the second width.

In this embodiment, the pixel units 21 of the first display area 11 comprise red pixel units, green pixel units, and blue pixel units. The red pixel units may be pixel units of the light-emitting portions 211 that directly emit red light; the green pixel units may be pixel units of the light-emitting portions 211 that directly emit green light; and the blue pixel units may be pixel units of the light-emitting portions 211 that directly emit blue light.

In this embodiment, the first pixel units 22 comprise red pixel units and/or blue pixel units; and the second pixel units 23 comprise green pixel units. For example, the second pixel units 23 are green pixel units, and the first pixel units are red pixel units and blue pixel units. Since the green pixel units have the highest luminous efficiency, by setting a minimum width of second portions of anodes of the green pixel units in the first display area 11 greater than a minimum width of second portions of anodes of the red pixel units and the blue pixel units in the first display area 11, it can more efficiently increase brightness of the first display area 11 and can eliminate differences in brightness between the first display area 11 and the second display area 12 in wide viewing angles. Of course, in other embodiments of the present disclosure, the pixel units 21 may also comprise white pixel units. In this case, the second pixel units 23 may be white pixel units and/or green pixel units.

In this embodiment, sizes of the light-emitting portions of the pixel units 21 of a same color on the first display area 11 of the display panel are all same, and sizes of the light-emitting portions of the pixel units 21 of different colors are all different. Colors of the second pixel units 23 are different from the colors of the first pixel units 22, and areas of the light-emitting portions 222 in the first pixel units 22 are greater than areas of the light-emitting portions 232 in the second pixel units 23. Since the light-emitting portions 232 of the second pixel units 23 have smaller areas, when the second pixel units 23 aim to obtain the second widths W2 greater than the first widths W1, the anodes of the second pixel units 23 can have larger external expansion areas without affecting adjacent pixel units thereof. Preferably, the second pixel units 23 are green pixel units, the first pixel units are red pixel units and blue pixel units, areas of the light-emitting portions of the red pixel units are largest, areas of the light-emitting portions of the blue pixel units are second largest, and areas of the light-emitting portions of the green pixel units are smallest. That is, the second pixel units 23 have higher luminous efficiency than the first pixel units 22, and the second widths W2 thereof can be set greater. Preferably, a difference between the second width W2 and the first width W1 is greater than or equal to 0.1 µm.

In this embodiment, a ratio of the second portion 231 of the anode in each of the second pixel units 23 to a total area of the anode in the second pixel unit 23 is greater than or equal to 47.16% (for example: 50%, 55%, 60%, 65%, 70%, etc.). Preferably, the minimum width (i.e., the first width W1) of the second portion 221 of the anode in each of the first pixel units 22 is same, and the minimum width (i.e., the second width W2) of the second portion 231 of the anode in each of the second pixel units 23 is same, and the difference between the first width W1 and the second width W2 is greater than or equal to 0.1 µm. This embodiment does not limit sizes of the anode and the light-emitting portion 222 of each first pixel unit 22 and sizes of the anode and the light-emitting portion 232 of each second pixel unit 23. The plurality of first pixel units 22 may comprise a plurality of anodes of different sizes and a plurality of light-emitting portions 222 of different sizes; and the plurality of second pixel units 23 may also comprise a plurality of anodes of different sizes and a plurality of light-emitting portions 232 of different sizes.

Figure 5:
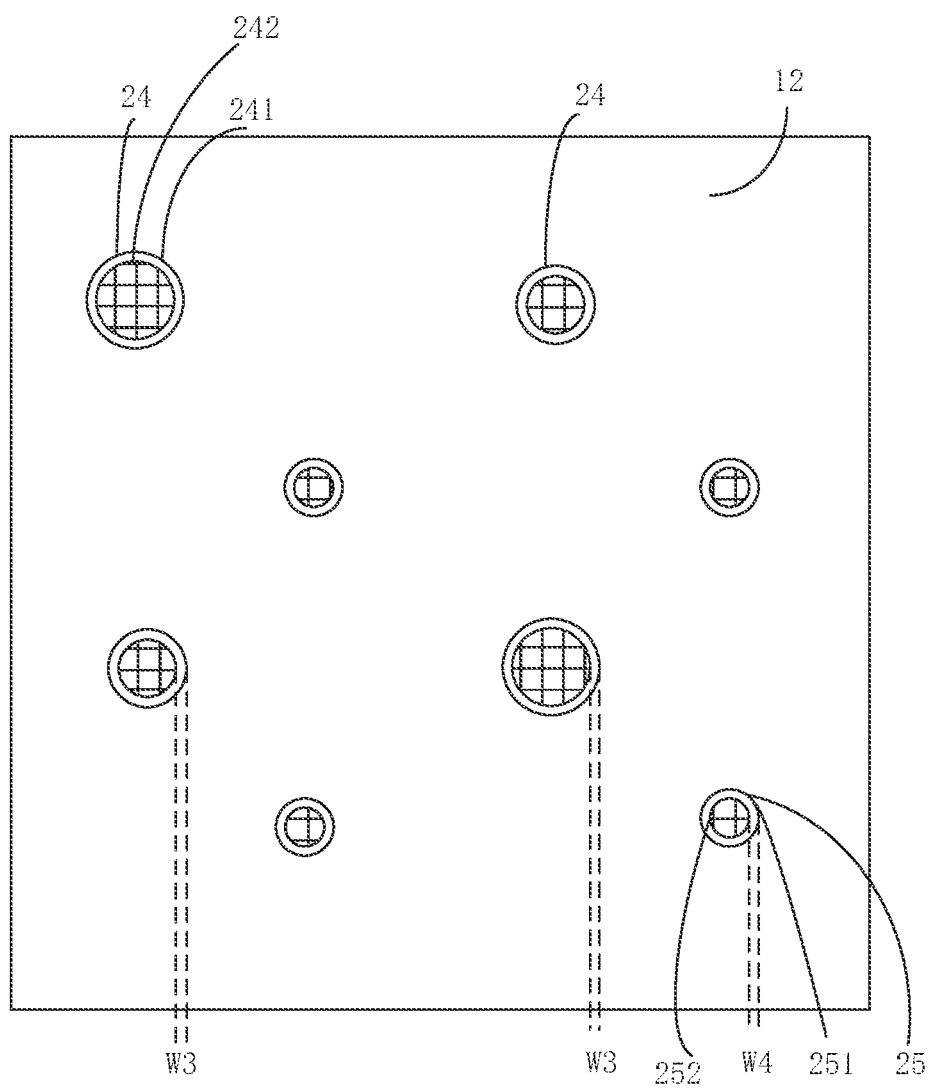
FIG. 5 is a schematic structural diagram of anodes and light-emitting portions of pixel units of a second display area provided by the first embodiment of the present disclosure.
Figure 6:
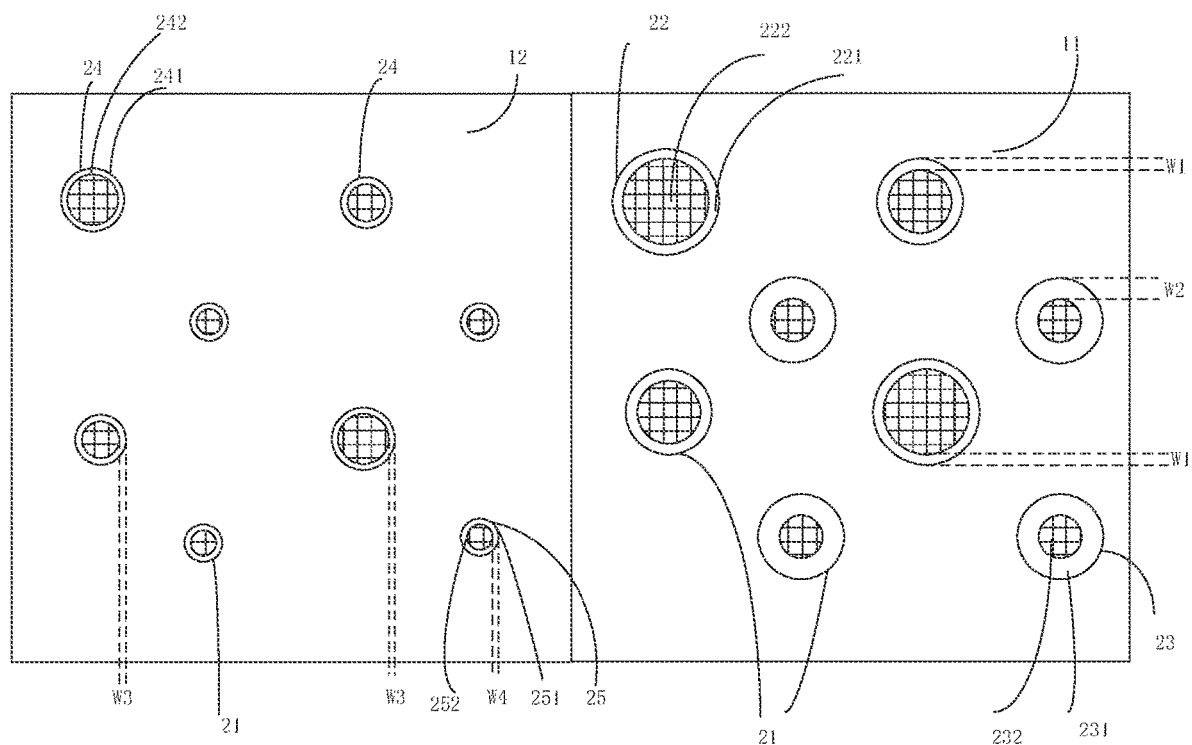
FIG. 6 is a schematic structural diagram of the anodes and the light-emitting portions of the pixel units of the first display area and the second display area provided by the first embodiment of the present disclosure.

FIG. 5 is a schematic structural diagram of anodes and light-emitting portions of the pixel units in the second display area provided by the first embodiment of the present disclosure; and FIG. 6 is a schematic structural diagram of the anodes and the light-emitting portions of the pixel units in the first display area and the second display area provided by the first embodiment of the present disclosure. As shown in FIGS. 1-6, in this embodiment, the pixel units 21 comprise third pixel units 24 that emit light of the same color as the first pixel units 22 and fourth pixel units 25 that emit light of the same color as the second pixel units 23 in the second display area 12 of the display panel. For example, in this embodiment, the third pixel units 24 are red pixel units and blue pixel units, and the fourth pixel units 25 are green pixel units. A minimum width of a second portion 241 of an anode of each of the third pixel units 24 is a third width W3, a minimum width of a second portion 251 of an anode of each of the fourth pixel units 25 is a fourth width W4, and the third width W3 and the fourth width W4 are less than the second width W2. Preferably, the third width W3 and the fourth width W4 are same and less than the first width W1, and the second width W2 is greater than the first width W1. Therefore, the anodes of the second pixel units of the first display area 11 can reflect more light generated by the corresponding second pixel units, so that the amount of light output from the first display area at wide viewing angles is increased, the brightness of light is increased, and light output angles of the second pixel units at wide viewing angles are increased, thereby improving the consistency of the display effects of the first display area and the second display area, improving the display effect of the display panel at wide viewing angles, and preventing the user experience from being compromised due to differences in brightness of the display panel at wide viewing angles.

In this embodiment, the second portion 241 of each third pixel unit 24 forms a third annular portion, and the second portion 251 of each fourth pixel unit 25 forms a fourth annular portion. A difference between a maximum width and a minimum width of the third annular portions and the fourth annular portions is defined as a, wherein 0≤a≤0.1 µm; that is, the second portion 241 of each third pixel unit 24 and the second portion 251 of each fourth pixel unit 25 are annular areas of fixed width difference interval. Of course, the present disclosure does not limit a margin of width difference of the annular portions of the third pixel units 24 and a margin of width difference of the annular portions of the fourth pixel units 25. In other embodiments, the margin of width difference may be greater than 0.1 µm.

Further, a pattern formed by an edge of an anode of each of the third pixel units 24 is same as a pattern formed by an edge of a light-emitting portion of the third pixel unit 24, and a pattern of an edge of an anode of each of the fourth pixel units 25 is same as a pattern of an edge of a light-emitting portion of the fourth pixel unit 25, for example, a circle. In other embodiments of the present disclosure, the pattern may also be an oval, a diamond, a triangle, a pearl, other polygons, or any irregular shape, and specific shapes of which may be adaptively set according to actual needs and is not limited here by this embodiment.

In this embodiment, densities of pixel units in the first display area 11 and the second display area 12 of the display panel are same, i.e., a number of pixel units in a unit area is fixed. Specifically, each pixel unit corresponds to a fixed unit area. Further, the first pixel units 22 of the first display area 11 are red pixel units and blue pixel units, the second pixel units 23 of the first display area 11 are green pixel units. The third pixel units 24 of the second display area 12 are red pixel units and blue pixel units, and the fourth pixel units 25 of the second display area 12 are green pixel units. The light-emitting portions 211 of the pixel units of a same color in the first display area 11 are all same in size, and the light-emitting portions 211 of the pixel units of same color in the second display area 12 are all same in size. Wherein, the size of the red pixel units in the first display area 11 is greater than the size of the red pixel units in the second display area 12; the size of the green pixel units in the first display area 11 is greater than the size of the green pixel units in the second display area 12; and the size of the blue pixel units in the first display area 11 is greater than the size of the blue pixel units in the second display area 12. Further, the pixel units of a same color in the first display area 11 have a same size, and the pixel units of different colors have different sizes; the pixel units of a same color in the second display area 12 have a same size, and the pixel units of different colors have different sizes. It should be noted that since the cathodes of the pixel units are generally disposed on an entire surface, when comparing sizes of two pixel units, only the sizes of the anodes and the light-emitting portions in the two pixel units are compared. That is, when the pixel unit 21 of the first display area 11 is greater than the pixel unit 21 of a same color of the second display area 12, the area of the anode of the second pixel unit 23 is greater than the area of the anode of the fourth pixel unit 25 of a same color, and the area of the anode of the first pixel unit 22 is greater than the area of the anode of the third pixel unit 24 of a same color; and the area of the light-emitting portion 232 of the second pixel unit 23 is greater than the area of the light-emitting portion 252 of the fourth pixel unit 25 of a same color, and the area of the light-emitting portion 222 of the first pixel unit 22 is greater than the area of the light-emitting portion 242 of the third pixel unit 24 of a same color. Moreover, since the area of the light-emitting portion of the pixel unit of each color in the second display area is less than the area of the light-emitting portion of the pixel unit of a corresponding color in the first display area, the brightness of the pixels of the second display area 12 is less, and an effect of eliminating differences in brightness of the first display area 11 and the second display area 12 can be achieved.

In this embodiment, an arrangement manner of the pixel units 21 in the first display area 11 of the display panel is, for example, a diamond pixel arrangement manner or a delta pixel arrangement manner, or a pearl pixel arrangement manner or a two-in-one pixel arrangement manner, etc.; and an arrangement manner of the pixel units 21 in the second display area 12 of the display panel is, for example, a diamond pixel arrangement manner or a delta pixel arrangement manner, or a pearl pixel arrangement manner or a two-in-one pixel arrangement manner, etc. Preferably, the arrangement manner of the pixel units in the first display area 11 and the arrangement manner of the pixel units in the second display area 12 are same.

This embodiment further discloses a display device, which comprises a camera and the above-mentioned display panel, and the camera is disposed on a side of the display panel corresponding to the second display area 12.

Specifically, the first display area 11 of the display panel is a normal display area, and the second display area of the display panel is a transmission display area, and the transmission display area has a transmission function and a display function.

When the first display area 11 performs the display function, the plurality of pixel units 21 located in the first display area 11 emit light driven by the pixel driving circuit on the array substrate 10; and when the second display area 12 performs the display function, the plurality of pixel units 21 located in the second display area 12 emit light driven by the pixel driving circuit on the array substrate 10, and the camera located on a side of the transmission display area is blocked by the transmission display area and cannot be observed by an user or a terminal located on a side of the transmission display area away from the camera. That is, when the first display area 11 and the second display area 12 both perform the display function, the camera can be hidden, the display panel can truly display in full screen. In addition, since the first display area 11 is provided with the first pixel units 22 and the second pixel units 23, and the widths of the second portions 231 of the anodes of the second pixel units 23 are greater than the widths of conventional first pixel units 22, and the second pixel units 23 have the highest luminous efficiency, so that the brightness of the first display area 11 is effectively improved, and the problem of differences in brightness of the display panel and the display device at wide viewing angles caused by a higher light transmittance of a touch film layer of the second display area 12 is prevented.

When the first display area 11 performs the display function, the pixel units 21 located in the first display area 11 emit light under driving of the pixel driving circuit on the array substrate 10. When the second display area 12 performs the transmission function, several pixel units located in the second display area 20 do not emit light, the transmission display area is in a transmission state, and the camera on a side of the transmission display area has a higher light transmittance due to the touch film layer, so that ambient light incident on the second display area 12 from the outside is better received, so as to realize light-sensing and photographing functions.

It should be noted that, to make the second widths W2 of the second pixel units 23 greater than the first widths W1 of the first pixel units 22, in addition to directly expanding the anodes in the second pixel units 23, it can also be realized by reducing the light-emitting portions 232 in the pixel units 23. Although this method reduces the areas of the light-emitting portions 232 in the second pixel units 23, brightness loss caused by the reduced areas of the light-emitting portions 232 can be compensated by applying higher gamma voltages to the second pixel units 23 through a display driving circuit system of the display panel. This method guarantees the light-emitting effect and at same time, due to the shrinkages of the light-emitting portions of the second pixel units, it is more difficult for the second pixel units to be blocked by metal wires in the touch layer 40 located above at wide viewing angles, which can also achieve a good effect of eliminating differences in brightness at wide viewing angles.

A Second Embodiment

Figure 7:
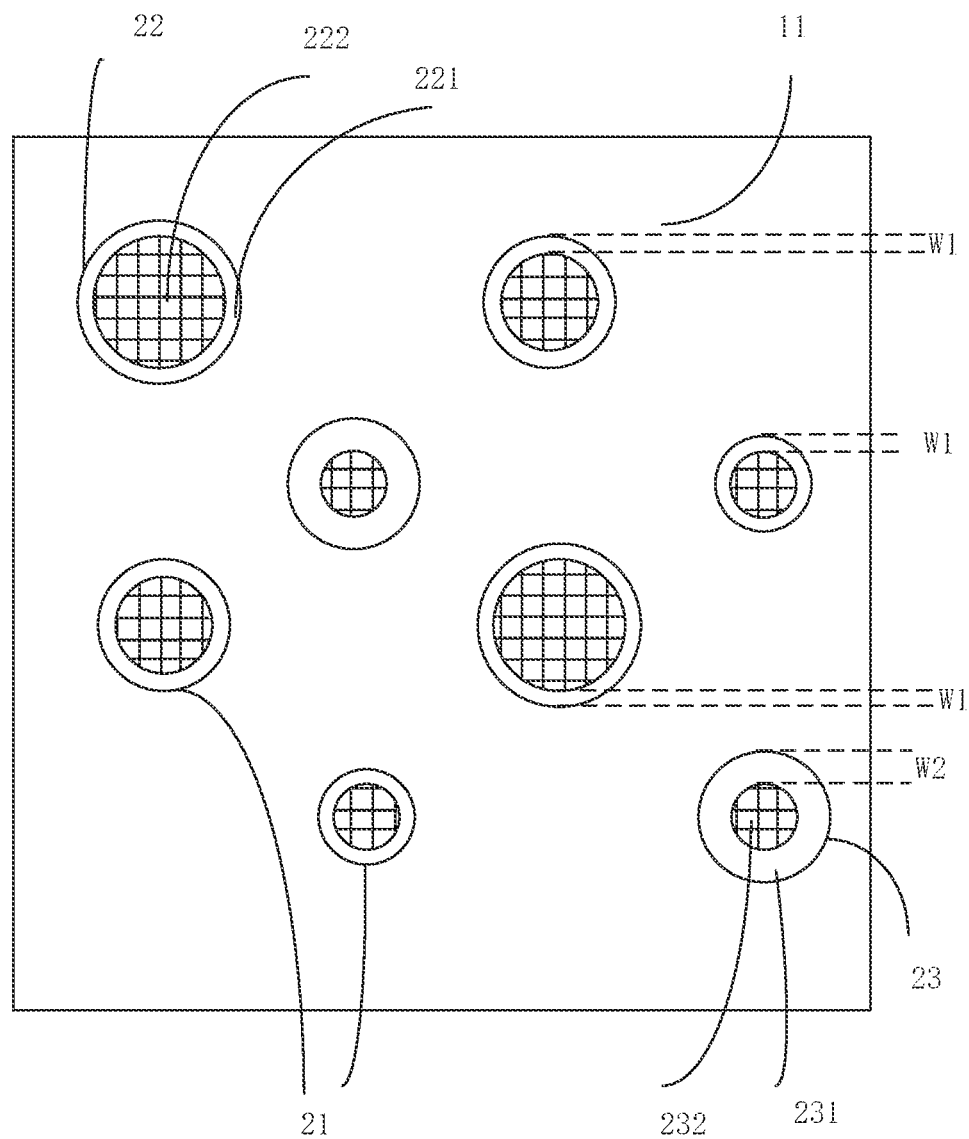
FIG. 7 is a schematic structural diagram of anodes and light-emitting portions of pixel units of a first display area provided by a second embodiment of the present disclosure.

FIG. 7 is a schematic structural diagram of anodes and light-emitting portions of pixel units of a first display area provided in a second embodiment of the present disclosure. As shown in FIG. 7, the display panel and the display device disclosed in the second embodiment of the present disclosure are similar to the display panel and the display device in the first embodiment, and same parts are not repeated here in this embodiment. The difference is that the second width W2 of at least one second pixel unit 23 is greater than all the first widths W1, and the second widths W2 of the other second pixel units are equal to the largest first width W1. For example, in the first display area 11, the first widths W1 of all the first pixel units 22 are same; and in every four second pixel units 23, the second widths W2 of two of the second pixel units 23 are greater than the first width W1, and the second widths W2 of the other two second pixel units 23 are equal to the first width W1. In addition, for example, when the first widths W1 of the plurality of first pixel units 22 are different, the second widths W2 of the two second pixel units 23 are greater than the greatest first width W1. Preferably, the second pixel units 23 are green pixel units, and the first pixel units 22 are red pixel units and blue pixel units. The light-emitting portion of each green pixel unit has same size, and in every four green pixel units, the sizes of the anodes of two green pixel units are greater than the sizes of the anodes of the other two green pixel units.

A Third Embodiment

Figure 8:
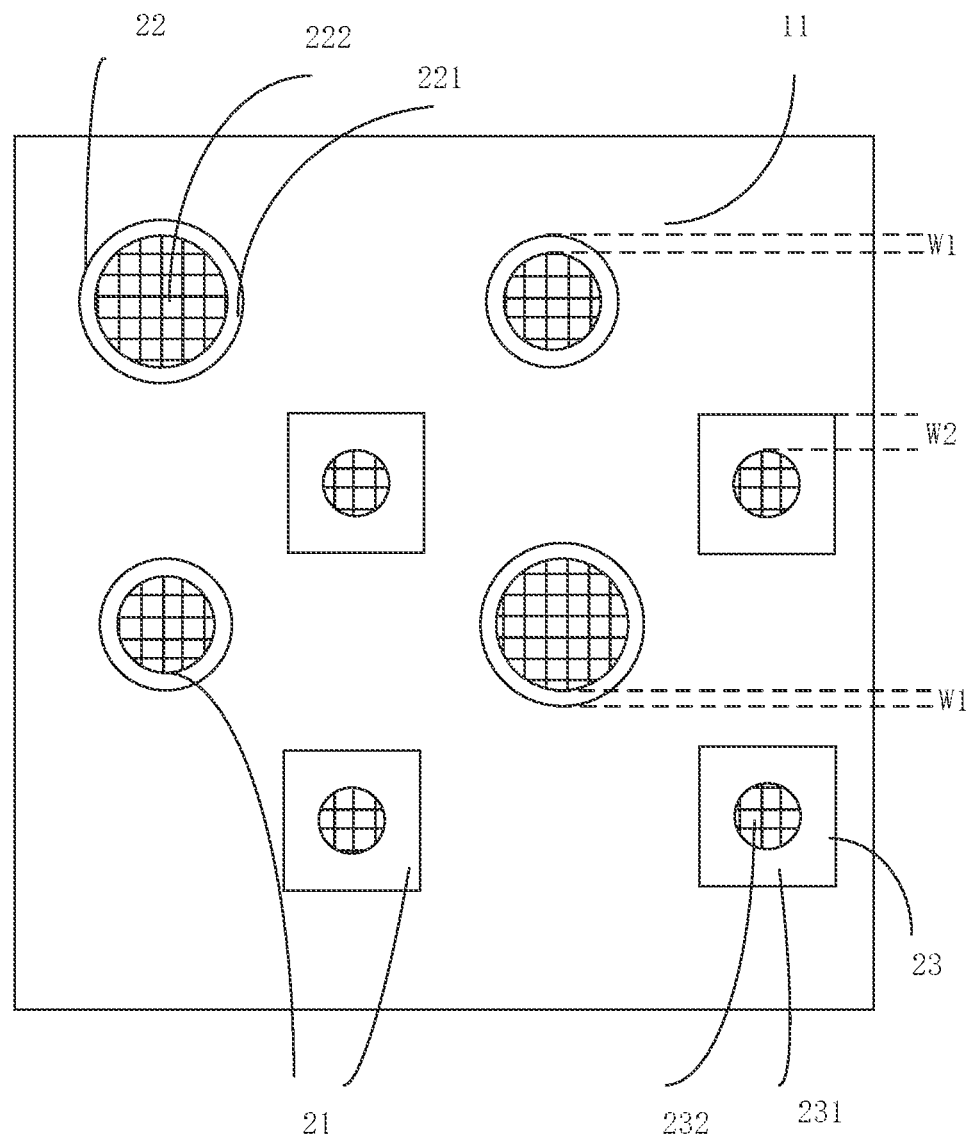
FIG. 8 is a schematic structural diagram of anodes and light-emitting portions of pixel units of a first display area provided by a third embodiment of the present disclosure.

FIG. 8 is a schematic structural diagram of anodes and light-emitting portions of pixel units of a first display area provided in a third embodiment of the present disclosure. As shown in FIG. 8, the display panel and the display device disclosed in the third embodiment of the present disclosure is similar to the display panel and the display device in the first embodiment, and same parts are not repeated here in this embodiment. The difference is that a pattern delineated by the edge of the anode of the second pixel unit 22 is different from a pattern delineated by the edge of the light-emitting portion of the second pixel unit 22. In this embodiment, shapes of the anodes of all the second pixel units 23 of the first display area 11 of the display panel are rectangles, and shapes of all the light-emitting portions 232 of the second pixel units 23 are circles, and the circles are located at center positions of the rectangles. The widths of the second portions 231 of the anodes of the second pixel units 23 have a width interval, a minimum value of the width interval is a minimum distance from a midpoint of one side of the rectangle to the circle, and a maximum value of the width interval is a minimum distance from a corner of the rectangle to the circle. Specifically, a difference value between the maximum width and the minimum width of the second portions 231 of the second pixel units 23 is greater than 0.1 μm. The present disclosure does not limit the maximum value of the difference, as long as the arrangements of the second pixel units 23 do not affect the adjacent pixel units 21. It should be noted that the shapes of the second pixel units 23 are not limited to the rectangle in this embodiment. In other embodiments, it may also be ellipses, diamonds, triangles, pearls, other polygons, or any irregularities. The specific shape can be adaptively set according to actual needs, which is not limited in this embodiment.

The present disclosure provides a display panel and a display device. The display panel comprises: an array substrate; a plurality of pixel units disposed on the array substrate, wherein each pixel unit comprises an anode, a light-emitting portion, and a cathode that are stacked in sequence; an encapsulation layer disposed on the plurality of pixel units; a touch layer disposed on the encapsulation layer; wherein, the display panel is provided with a first display area and a second display area adjacent to the first display area, and a light transmittance of the touch layer in the first display area is less than a light transmittance of the touch layer in the second display area; in the first display area, the plurality of pixel units comprise first pixel units and second pixel units, and a minimum distance between an edge of an anode of at least one of the second pixel units and an edge of a corresponding light-emitting portion is greater than a minimum distance between an edge of an anode of the first pixel unit and an edge of a corresponding light-emitting portion. In the display panel and the display device provided by the present disclosure, in the first display area, by setting the minimum distance between the edge of the anode of at least one of second pixel unit of the plurality of pixel units in the first display area and the edge of the corresponding light-emitting portion greater than the minimum distance between the edge of the anode of the first pixel unit and the edge of the corresponding light-emitting portion, anode areas of at least parts of the second pixel units are additionally increased, and the increased anode areas of the second pixel units can be configured to reflect light generated by the corresponding second pixel units, which increases amount of light output from the first display area at wide viewing angles, improves consistency of display effects of the first display area and the second display area, improves display effect of the display panel at wide viewing angles, and prevents problems of reducing user experience caused by differences in brightness of the display panel at wide viewing angles.

When discussing a size of a plane area in the present disclosure, the "size" specifically refers to the "area" of the plane area. The above is a detailed introduction to a display panel and a display device provided by the embodiments of the present disclosure. Specific examples are used in this article to illustrate the principles and implementations of the present disclosure. The descriptions of the above embodiments are only used to help understand the present disclosure. At the same time, for those skilled in the art, according to the idea of the present disclosure, there will be changes in the specific implementation and the scope of the present disclosure. In summary, the content of this specification should not be construed as a limitation to the present disclosure.

What is claimed is:

1. A display panel, comprising:
an array substrate;
a plurality of pixel units disposed on the array substrate, the pixel units respectively comprising a plurality of anodes composed of an opaque material, a plurality of light-emitting portions and a plurality of cathodes that are sequentially stacked;
an encapsulation layer disposed on the pixel units; and
a touch layer disposed on the encapsulation layer,
wherein the display panel comprises a first display area and a second display area disposed adjacent to the first display area, and a light transmittance of the touch layer in the first display area is less than a light transmittance of the touch layer in the second display area;
in the first display area, the pixel units comprise first pixel units and second pixel units, and a minimum distance between an edge of one of the anodes of at least one of the second pixel units and an edge of one of the light-emitting portions of the at least one of the second pixel units is greater than a minimum distance between an edge of one of the anodes of each of the first pixel units and an edge of one of the light-emitting portions of the each of the first pixel units;
the anodes respectively comprise a plurality of first portions respectively overlapping the plurality of light-emitting portions and a plurality of second portions respectively disposed around the first portions, ones of the second portions of the first pixel units respectively have minimum widths as first widths, ones of the second portions of the second pixel units respectively have minimum widths as second widths, and at least one of the second widths is greater than each of the first widths; and
each of the ones of the second portions of the first pixel units forms a first annular portion, and a difference between a maximum width and a minimum width of the first annular portion is defined as a; each of the ones of the second portions of the second pixels forms a second annular portion, and a difference between a maximum width and a minimum width of the second annular portion is defined as b; and 0 µm≤a≤0.1 µm, and b≥0 µm.

2. The display panel of claim 1, wherein each of the second widths is greater than each of the first widths, or
each of ones of the second widths other than the at least one of the second widths is equal to a largest one of the first widths.

3. The display panel of claim 1, wherein a pattern delineated by an edge of the one of the anodes of each of the first pixel units is same as a pattern delineated by an edge of the one of the light-emitting portions of each of the first pixel units; and a pattern delineated by an edge of the one of the anodes of at least one of the second pixel units is same as or different from a pattern delineated by an edge of the one of the light-emitting portions of the at least one of the second pixel units.

4. The display panel of claim 1, wherein the first pixel units and the second pixel units emit light of different colors, and each of areas of ones of the light-emitting portions of the first pixel units is greater than each of areas of ones of the light-emitting portions of the second pixel units.

5. The display panel of claim 1, wherein a ratio of an area of each of the ones of the second portions of the second pixel units to a total area of each of ones of the anodes of the second pixel units is greater than or equal to 47.16%.

6. The display panel of claim 1, wherein each of the first widths is same, each of the second widths is same, and a difference between each of the second widths and each of the first widths is greater than or equal to 0.1 µm.

7. The display panel of claim 4, wherein the first pixel units comprise red pixel units and/or blue pixel units, and the second pixel units comprise green pixel units.

8. The display panel of claim 1, wherein in the second display area, the pixel units comprise third pixel units that emit light of a same color as the first pixel units and fourth pixel units that emit light of a same color as the second pixel units; and ones of the second portions of the third pixel units respectively have minimum widths as third widths, ones of the second portions of the fourth pixel units respectively have minimum widths as fourth widths, and each of the first widths, the third widths, and the fourth widths is less than each of the second widths.

9. The display panel of claim 8, wherein a pattern delineated by an edge of one of the anodes of each of the third pixel units is same as a pattern delineated by an edge of one of the light-emitting portions of each of the third pixel units; and a pattern delineated by an edge of one of the anodes of each of the fourth pixel units is same as a pattern delineated by an edge of one of the of light-emitting portions of each of the fourth pixel units.

10. The display panel of claim 9, wherein each of the third widths is same as each of the fourth widths.

11. The display panel of claim 9, wherein the touch layer is defined with an opening at a position in the second display area, and a density of ones of the pixel units in the second display area is same as a density of ones of the pixel units in the first display area.

12. The display panel of claim 11, wherein each of areas of ones of the light-emitting portions of the third pixel units is less than each of areas of ones of the light-emitting portions of the first pixel units, and each of areas of ones of the light-emitting portions of the fourth pixel units is less than each of areas of ones of the light-emitting portions of the second pixel units.

13. A display device, comprising a camera and a display panel, and the camera is disposed on a side of the display panel corresponding to a second display area, wherein the display panel comprises:

an array substrate;
a plurality of pixel units disposed on the array substrate, the pixel units respectively comprising a plurality of anodes composed of an opaque material, a plurality of light-emitting portions and a plurality of cathodes that are sequentially stacked;
an encapsulation layer disposed on the pixel units; and
a touch layer disposed on the encapsulation layer,
wherein the display panel comprises a first display area and a second display area disposed adjacent to the first display area, and a light transmittance of the touch layer in the first display area is less than a light transmittance of the touch layer in the second display area;
in the first display area, the pixel units comprise first pixel units and second pixel units, and a minimum distance between an edge of one of the anodes of at least one of the second pixel units and an edge of one of the light-emitting portions of the at least one of second pixel units is greater than a minimum distance between an edge of one of the anodes of each of the first pixel units and an edge of one of the light-emitting portions of the each of the first pixel units;
the anodes respectively comprise a plurality of first portions respectively overlapping the plurality of light-emitting portions and a plurality of second portions respectively disposed around the first portions, ones of the second portions of the first pixel units respectively have minimum widths as first widths, ones of the second portions of the second pixel units respectively have minimum widths as second widths, and at least one of the second widths is greater than each of the first widths;

in the second display area, the pixel units comprise third pixel units that emit light of a same color as the first pixel units and fourth pixel units that emit light of a same color as the second pixel units; and ones of the second portions of the third pixel units respectively have minimum widths as third widths, ones of the second portions of the fourth pixel units respectively have minimum widths as fourth widths, and each of the first widths, the third widths, and the fourth widths is less than each of the second widths.

14. The display device of claim 9, wherein each of the second widths is greater than each of the first widths, or each of ones of the second widths other than the at least one of the second widths is equal to a largest one of the first widths.

15. The display device of claim 13, wherein the first pixel units and the second pixel units emit light of different colors, and each of areas of ones of the light-emitting portions of the first pixel units is greater than each of areas of ones of the light-emitting portions of the second pixel units.

16. The display device of claim 15, wherein the first pixel units comprise red pixel units and/or blue pixel units, and the second pixel units comprise green pixel units.

17. A display panel, comprising:
an array substrate;
a plurality of pixel units disposed on the array substrate, the pixel units respectively comprising a plurality of anodes composed of an opaque material, a plurality of light-emitting portions and a plurality of cathodes that are sequentially stacked;
an encapsulation layer disposed on the pixel units; and
a touch layer disposed on the encapsulation layer,
wherein the display panel comprises a first display area and a second display area disposed adjacent to the first display area, and a light transmittance of the touch layer in the first display area is less than a light transmittance of the touch layer in the second display area;
in the first display area, the pixel units comprise first pixel units and second pixel units, and a minimum distance between an edge of one of the anodes of at least one of the second pixel units and an edge of one of the light-emitting portions of the at least one of the second pixel units is greater than a minimum distance between an edge of one of the anodes of each of the first pixel units and an edge of one of the light-emitting portions of the each of the first pixel units,
the anodes respectively comprise a plurality of first portions respectively overlapping the plurality of light-emitting portions and a plurality of second portions respectively disposed around the first portions, ones of the second portions of the first pixel units respectively have minimum widths as first widths, ones of the second portions of the second pixel units respectively have minimum widths as second widths, and at least one of the second widths is greater than each of the first widths;
in the second display area, the pixel units comprise third pixel units that emit light of a same color as the first pixel units and fourth pixel units that emit light of a same color as the second pixel units; and
ones of the second portions of the third pixel units respectively have minimum widths as third widths, ones of the second portions of the fourth pixel units respectively have minimum widths as fourth widths, and each of the first widths, the third widths, and the fourth widths is less than each of the second widths.

18. The display panel of claim 17, wherein a pattern delineated by an edge of one of the anodes of each of the third pixel units is same as a pattern delineated by an edge of one of the light-emitting portions of each of the third pixel units; and a pattern delineated by an edge of one of the anodes of each of the fourth pixel units is same as a pattern delineated by an edge of one of the of light-emitting portions of each of the fourth pixel units.

19. The display panel of claim 18, wherein each of the third widths is same as each of the fourth widths.

20. The display panel of claim 18, wherein the touch layer is defined with an opening at a position in the second display area, and a density of ones of the pixel units in the second display area is same as a density of ones of the pixel units in the first display area.

* * * * *